United States Patent
Kurcik et al.

(10) Patent No.: US 11,495,836 B2
(45) Date of Patent: Nov. 8, 2022

(54) CONTROL UNIT FOR A BATTERY SYSTEM

(71) Applicant: Samsung SDI Co., Ltd., Yongin-si (KR)

(72) Inventors: Peter Kurcik, Sankt Nikolai im Sausal (AT); Markus Pretschuh, Graz (AT); Maximilian Hofer, Hartberg (AT)

(73) Assignee: Samsung SDI Co., Ltd., Yongin-si (KR)

( * ) Notice: Subject to any disclaimer, the term of this patent is extended or adjusted under 35 U.S.C. 154(b) by 67 days.

(21) Appl. No.: 17/074,517

(22) Filed: Oct. 19, 2020

(65) Prior Publication Data
US 2021/0143486 A1 May 13, 2021

(30) Foreign Application Priority Data

Nov. 11, 2019 (EP) ..................................... 19208219
Sep. 29, 2020 (KR) ........................ 10-2020-0127322

(51) Int. Cl.
*H02J 7/00* (2006.01)
*H01M 10/42* (2006.01)
*G01R 31/3842* (2019.01)

(52) U.S. Cl.
CPC ...... *H01M 10/425* (2013.01); *G01R 31/3842* (2019.01); *H01M 10/4207* (2013.01);
(Continued)

(58) Field of Classification Search
USPC .................. 320/106, 107, 108, 110, 134, 162
See application file for complete search history.

(56) References Cited

U.S. PATENT DOCUMENTS 7,728,553 B2    6/2010 Carrier et al.
10,135,234 B2 * 11/2018 Yano ........................ H02H 3/10
(Continued)

FOREIGN PATENT DOCUMENTS

CA    2 338 282 A1    2/2000
EP    1 780 867 B1    11/2016
(Continued)

OTHER PUBLICATIONS

Extended European Search Report for corresponding European Patent Application No. 19208219.6, dated Apr. 23, 2020, 14pp.
(Continued)

*Primary Examiner* — Brian Ngo
(74) *Attorney, Agent, or Firm* — Lewis Roca Rothgerber Christie LLP

(57) ABSTRACT

A control unit for a battery system, comprising: a microcontroller configured to generate a first control signal; a monitoring unit configured to generate a fault signal indicative of the operational state of the microcontroller; a first signal source configured to generate a state signal indicative of a system state; a comparator circuit configured to generate an intermediate control signal based on a first control signal and a fault signal; the comparator circuit further comprising a comparator node, the comparator circuit configured to transmit the intermediate control signal to the comparator node; wherein the first signal source is connected to the comparator node to transmit the state signal to the comparator node; the comparator circuit further comprises a comparator connected to the comparator node and configured to generate a switch control signal based on a voltage on the comparator node and based on a threshold voltage.

15 Claims, 2 Drawing Sheets

(52) U.S. Cl.
CPC .......... *H02J 7/0031* (2013.01); *H02J 7/0068* (2013.01); *H01M 2010/4278* (2013.01); *H01M 2200/108* (2013.01); *H01M 2220/20* (2013.01)

(56) References Cited

U.S. PATENT DOCUMENTS

| | | | |
|---|---|---|---|
| 2003/0015995 A1* | 1/2003 | Tamura | H02J 7/0014 320/162 |
| 2009/0087722 A1 | 4/2009 | Sakabe et al. | |
| 2011/0002068 A1* | 1/2011 | Hu | H02M 1/32 361/18 |
| 2011/0140669 A1 | 6/2011 | Murakami et al. | |
| 2016/0226107 A1 | 8/2016 | Worry et al. | |
| 2018/0024195 A1* | 1/2018 | Takamura | G01R 31/327 324/380 |
| 2019/0393796 A1* | 12/2019 | Fukushima | H02H 7/0827 |
| 2020/0020992 A1 | 1/2020 | Hofer et al. | |

FOREIGN PATENT DOCUMENTS

| | | | | |
|---|---|---|---|---|
| EP | 3 595 076 A1 | 1/2020 | | |
| KR | 10-2002-0030541 A | 4/2002 | | |
| WO | WO-2010109990 A1 * | 9/2010 | ............. | B60L 11/18 |

OTHER PUBLICATIONS

EPO Office Action dated Oct. 19, 2021, issued in corresponding European Patent Application No. 19208219.6 (8 pages).
Korean Office Action (with English translation) for KR 10-2020-0127322 dated Jun. 30, 2022, 13 pages.

\* cited by examiner

CONTROL UNIT FOR A BATTERY SYSTEM

CROSS-REFERENCE TO RELATED APPLICATION

The present application claims priority to and the benefit of European Patent Application No. 19208219.6, filed in the European Patent Office on Nov. 11, 2019, and Korean Patent Application No. 10-2020-0127322, filed in the Korean Intellectual Property Office on Sep. 29, 2020 the entire content of both of which are incorporated herein by reference.

BACKGROUND

1. Field

Aspects of some example embodiments of the present invention relate to a control unit for controlling a power switch of battery system.

2. Background

In recent years, vehicles have been developed using electric power as a source of motion. An electric vehicle is an automobile that is powered by an electric motor using energy stored in rechargeable batteries. An electric vehicle may be solely powered by batteries or may be a form of hybrid vehicle powered by for example a gasoline generator. Furthermore, the vehicle may include a combination of an electric motor and a combustion engine. In general, an electric-vehicle battery (EVB) or a traction battery is a battery used to power the propulsion of a battery electric vehicle (BEV). Electric-vehicle batteries differ from starting, lighting, and ignition batteries because they are designed to provide power over sustained periods of time. A rechargeable or secondary battery differs from a primary battery in that it can be repeatedly charged and discharged, while the latter provides only an irreversible conversion of chemical to electrical energy. Low-capacity rechargeable batteries may be used, for example, as a power supply for small electronic devices, such as cellular phones, notebook computers and camcorders, while high-capacity rechargeable batteries may be used as a power supply for hybrid vehicles and the like.

The above information disclosed in this Background section is only for enhancement of understanding of the background and therefore the information discussed in this Background section does not necessarily constitute prior art.

SUMMARY

Aspects of some example embodiments of the present invention relate to a control unit for controlling a power switch of battery system. Further, aspects of some example embodiments of the present invention relate to a battery system comprising such a control unit. Furthermore, aspects of some example embodiments of the present invention relate to an electric vehicle comprising such battery system.

Rechargeable batteries may be used as a battery module formed of a plurality of unit battery cells coupled in series and/or in parallel so as to provide a relatively high energy density, for example, for motor driving of a hybrid vehicle. A battery module may be formed by interconnecting the electrode terminals of the plurality of unit battery cells depending on a required amount of power and in order to realize a high-power rechargeable battery. The cells can be connected in series, parallel or some combination of both to deliver the desired voltage, capacity, or power density. Components of battery packs include the individual battery modules and the interconnects, which provide electrical conductivity between them.

For meeting the dynamic power demands of various electrical components connected to the battery system, a static control of battery power output and charging may not be sufficient. Thus, a system that enables the steady exchange of information between the battery system and the controllers of the electrical consumers may be utilized. This information includes the battery systems actual state of charge, potential electrical performance, charging ability and internal resistance as well as actual or predicted power demands or surpluses of the electrical components.

Battery systems may include a battery control for processing the aforementioned information. The battery control may include one or more controllers to control the various electrical components, and may include or utilize suitable internal communication busses, e.g. a SPI or CAN interface. The battery control may further communicate with battery submodules, for example, with cell supervision circuits or cell connection and sensing units. Thus, the battery control may be utilized to manage the battery stack, such as by protecting the battery from operating outside a safe operating range, monitoring its state, calculating secondary data, reporting that data, controlling the environment of the battery, authenticating it and/or balancing it. In some instances, the battery control may control a power switch to a load and may switch the load in various fault situations.

A battery system may further include a protection system to provide a voltage level control of a power interface of the battery system and to enable a fast and reliable safety shutdown of the power interface in the case of non-permissible operating conditions. Such a protection system may be adapted to shutdown a power connection between the battery system and an external terminal of the battery system. A protection system may include a power switch that may be controlled by a microcontroller (MCU) of the battery system.

For example, the microcontroller for controlling such power switch, e.g. a relay, may also used for controlling other functions of the battery system. For example, the MCU may be part of the BMS/BMU of the battery system. However, with increasing capacity of the battery systems utilized in at least partially electrically powered vehicles, the high voltage (HV) batteries may be increasingly utilized for supplying security relevant functions of the vehicle such as, for example, steer-by-wire, autonomous driving, or crash protection. The availability of the HV batteries thus may become more important in order to provide security relevant functions with sufficient reliability.

For example, a failure rate of the battery system must be sufficiently low. For certain standards such as ASIL B a fit rate of 100 FIT ("failure in time", i.e. failures per $10^9$h) or less is required. As an example, an MCU used in common BMS/BMU systems may have a fit rate of up to 2000 FIT.

Related art control units of battery systems may not allow processing multiple inputs and may not provide any diagnostic capability.

Thus, aspects of some example embodiments of the present invention may include a control unit with relatively improved availability which allows a variable shutdown of the power switch prompted by additional signal sources and further enables a diagnostic feedback.

According to some example embodiments of the present disclosure, a control unit for a battery system for a vehicle is provided comprising: A microcontroller configured to generate a first control signal. The control unit further comprises a monitoring unit configured to detect an operational state of the microcontroller and configured to generate a fault signal indicative of the operational state of the microcontroller. The control unit further comprises a first signal source configured to generate a state signal indicative of a system state. The control unit further comprises a comparator circuit configured to receive the first control signal and the fault signal and configured to generate an intermediate control signal based on the first control signal and the fault signal. The comparator circuit further comprises a comparator node and the comparator circuit is configured to transmit the intermediate control signal to the comparator node. Further, the first signal source is connected to the comparator node to transmit the state signal to the comparator node. The comparator circuit further comprises a comparator connected to the comparator node and configured to generate a switch control signal based on a voltage on the comparator node and on a threshold voltage.

A monitor unit may be a system basis chip or a similar chip. The monitor unit may be integral in the microcontroller or external. The control signal may be generated in response to a detected system state. A system state may be a normal state, in which all relevant quantities are within allowable ranges. A fault state may be a case in which at least one quantity, e.g. a voltage, a temperature or a current etc., deviates from the allowable range. An intermediate control signal may be in other words a weighted control signal. The intermediate control signal may be in other words the control signal weighted by the fault signal. The fault signal is hereby used to ensure that a faulty microcontroller cannot control the power switch. For example, a high voltage value of a control signal, which may indicate a normal state, may be suppressed by the fault signal to an intermediate control signal with a zero voltage level leading to an opening of the power switch. The comparator may generate a switch control signal to close the power switch, when the node voltage is above the threshold voltage. The comparator may transmit a switch control signal to open the power switch, when the node voltage is below the threshold voltage. A high voltage value of a switch control signal may keep the power switch closed. A low voltage value may open/disable the power switch or, in other words expressed, set the power switch non-conductive, but the invention is not restricted thereto. Here and in general, the whole circuit may operate with logic where high voltage may mean that the state is ok or normal, where the power switch is closed. That may be done for the safety because it is much more likely that in case of malfunction the signals will default to a low value and in this case it is desired the switch to be open. A signal source may be a comparator which generates a state signal based on if a sensed or measured or determined quantity is above or below a threshold value. The signal source may be a temperature comparator, a voltage comparator or a current comparator, but the invention is not restricted thereto. The signal source may also be an AFE chip or a crash signal source, for example. The signal source may work with the same logic.

According to some example embodiments, the signal source can trigger a signal to the comparator node to subsequently trigger the power switch at any time, for example, when a fault state of the microcontroller is detected. Further, because the state signals and intermediate control signals are transmitted to the comparator node, the comparator node may contain diagnostic information which can be used for diagnostic purposes. For example, the microcontroller may be reset in response to the diagnostic information. The comparator and the corresponding comparator node may be referred to as a node comparator. The present solution provides an analog comparator concept and allows diagnosing all input signals transmitted to the node. In general, more than one signal source can be connected to the comparator node.

According to some example embodiments, the microcontroller may be configured to generate a second control signal and wherein the comparator circuit may be configured to receive the first control signal, the second control signal and the fault signal, and may be further configured to generate an intermediate control signal based on the first control signal, the second control signal and the fault signal and may be configured to transmit the intermediate control signal to the comparator node. Here, the intermediate control signal is weighted by a first and second control signal in combination with the fault signal. The threshold voltage may be set such that only when both control signals are on high value, i.e. generated in response to an ok system sate or normal state, the threshold is met by the intermediate control signal to close or keep closed the power switch. Only one high signal may not be sufficient and may lead to a switch control signal to open the power switch as the threshold voltage is not met. In the latter case, the node voltage may then be diagnosable on the comparator node.

According to some example embodiments, the comparator node may be interconnected between a first resistor and a second resistor, wherein the first resistor may be connected to the microcontroller via a first control line to receive the first control signal, wherein the second resistor may be connected to the microcontroller via a second control line to receive the second control signal. Thereby, the weighting of the two control signals is performed by a resistive voltage divider. This allows for defining stable voltage levels to be defined by the choice of the resistor values.

According to some example embodiments, a latch unit may be interconnected between the comparator node and the microcontroller, comprising a first input connected to the microcontroller to receive one of the first and second control signals, the second input connected to the monitoring unit to be controlled by the fault signal, wherein the latch unit is configured to latch the previous output, when the latch unit receives a fault signal indicative of a fault state of the microcontroller. To latch may be in other words to maintain. The latch function ensures that the microcontroller cannot toggle or change the output of the latch when the microcontroller is in a fault state. The latch may be a transparent latch. In a normal state of the microcontroller the control signal may be transmitted unchanged.

According to some example embodiments, an AND-operator is interconnected between the comparator node and the microcontroller comprising a first input connected to the microcontroller to receive one of the first and second control signals, the second input connected to the monitoring unit to receive the fault signal. The AND-operator may ensure that the output of the AND-operator is held at zero level when the microcontroller is in a fault state such that no power switch trigger can be initiated by the microcontroller. In combination with an AND-operator a microcontroller may be entirely hindered to switch the power switch.

According to some example embodiments, a time delay unit may be interconnected between the latch unit and the microcontroller and/or may be interconnected between the AND-operator and the microcontroller, the time delay unit may be configured to delay the first and/or the second control signal by a predetermined time. The time to detect a fault state of the microcontroller and the transmitting may take a certain identification time. The predetermined time may be higher than the identification time. Thereby it is prevented that a faulty microcontroller can transmit a control signal to the comparator node before the fault state is actually identified and the fault signal transmitted by the monitoring unit.

According to some example embodiments, the comparator circuit may comprise a diode interconnected between the first signal source and the comparator node. The diode may be a Schottky diode, but the invention is not restricted thereto. The diode may be used to be set conductive when the state signal is indicative of a fault state having a low voltage level and the voltage on the comparator node is then in response pulled to a low level below the threshold voltage to generate a power switch control signal to open the power witch.

According to some example embodiments, the comparator node may be connected to the microcontroller to receive a diagnostic signal indicative of the present voltage on the comparator node. The microcontroller receives thus diagnostic information. The diagnostic information may for example be used to restart or reset the microcontroller. Since all inputs are transmitted on the comparator node the comparator node may contain various diagnostic information.

According to some example embodiments, the control unit may comprise a first timer connected to the monitoring unit to receive the fault signal and configured to be activated by the fault signal, when the fault signal is indicative of a fault state of the microcontroller, wherein the first timer is connected to a second signal source and configured to activate the second signal source after a first time period, the second signal source may further be connected to the comparator node. The first timer starts when a failure of the microcontroller is detected. In this time interval still full power is provided. The master has time to reduce power consumption. In this first time window, the microcontroller can return to normal mode e.g. by resetting the microcontroller. The second source may be a comparator to control a reduced current limit compared to a current limit in the first time period.

According to some example embodiments, the control unit may further comprise a second timer connected to the monitoring unit to receive the fault signal and configured to be activated by the fault signal, when the fault signal is indicative of a fault state of the microcontroller, wherein the second timer is configured to shut down a power supply of the comparator, when the second time period lapsed, wherein the second time period is larger than the first time period. Thereby, a two timer configuration is provided. The second timer may also shut down a power switch after the second time period is lapsed.

According to some example embodiments, the intermediate signal may be lower than the threshold voltage, when the first and/or the second control signal are generated in response to a detected system fault; and/or wherein the state signal may be lower than the threshold voltage, when the state signal is indicative of a system fault. The state signal may thus be able to trigger the switch in principle at any time.

According to some example embodiments, the comparator may comprise a third resistor interconnected between the output of the comparator and a first input of the comparator which is connected to the comparator node. A feedback with hysteresis may be implemented thereby. In other words, the comparator refers to a Schmitt trigger. A stable switch control signal is thereby generated.

According to some example embodiments, the comparator may comprise a supply voltage connected in series with a fourth resistor and a fifth resistor, wherein a second input of the comparator is connected to a first node interconnected between the fourth resistor and the fourth resistor. Thereby, a voltage divider is implemented to adjust or to set the threshold voltage of the comparator.

According to some example embodiments, a battery system may comprise a plurality of battery cells electrically connected between a high voltage node and a low voltage node, a power switch interconnected between the high voltage node and the low voltage node, and a control unit according to one of the above described embodiments connected with the output of the comparator to a power switch driver of the power switch. The advantages may be the same as described above.

According to some example embodiments, an electric vehicle may comprise a battery system as described above.

Further aspects of some example embodiments of the present invention could be learned from the claims or the following description.

BRIEF DESCRIPTION OF THE DRAWINGS

Features will become apparent to those of ordinary skill in the art by describing in more detail aspects of some example embodiments with reference to the attached drawings in which.

DETAILED DESCRIPTION

Figure 1:
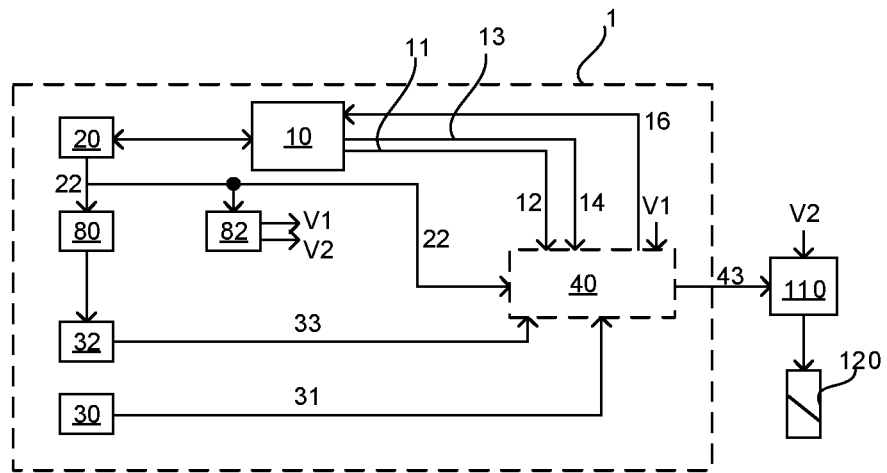
FIG. 1 illustrates a control unit for a battery system according to some example embodiments of the present invention.

Reference will now be made in more detail to aspects of some example embodiments, which are illustrated in the accompanying drawings. Effects and characteristics of the example embodiments, and implementation methods thereof will be described with reference to the accompanying drawings. In the drawings, like reference numerals denote like elements, and redundant descriptions are omitted. As used herein, the term "and/or" includes any and all combinations of one or more of the associated listed items. Further, the use of "may" when describing embodiments of the present invention refers to "one or more embodiments of the present invention."

It will be understood that although the terms "first" and "second" are used to describe various elements, these elements should not be limited by these terms. These terms are only used to distinguish one element from another element. For example, a first element may be named a second element and, similarly, a second element may be named a first element, without departing from the scope of the present invention.

In the following description of embodiments of the present invention, the terms of a singular form may include plural forms unless the context clearly indicates otherwise.

It will be further understood that the terms "include," "comprise," "including," or "comprising" specify a property, a region, a fixed number, a step, a process, an element, a component, and a combination thereof but do not exclude other properties, regions, fixed numbers, steps, processes, elements, components, and combinations thereof.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
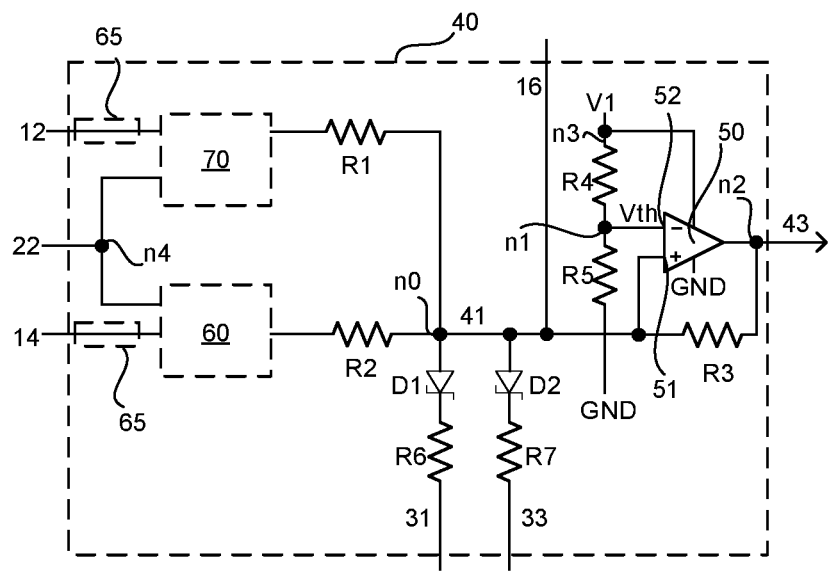
FIG. 2 illustrates a comparator circuit of the control unit according to some example embodiments of the present invention.
Figure 3:
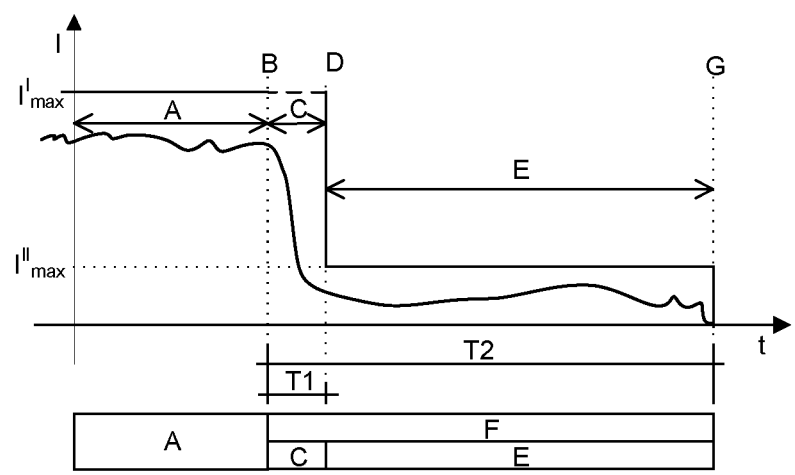
FIG. 3 illustrates a two timer current control diagram as function of time according to some example embodiments of the present invention.

FIG. 1 shows a control unit 1 for a battery system for controlling a power switch according to some example embodiments. FIG. 2 shows an example comparator circuit 40 according to some example embodiments of the present invention which may be used in the control unit 1 of FIG. 1. FIG. 3 shows a current control diagram as function of time with retention. In the following description, these Figures are described simultaneously, when appropriate.

FIG. 1 shows the control unit 1 according to some example embodiments of the present invention. The control unit 1 includes a microcontroller 10 or MCU. The microcontroller 10 may be configured to control the power switch driver 110 of a power switch 120. Therefore, the microcontroller 10 is configured to generate a first control signal 12. The first control signal 12 may be generated in response to a detected system state. The system state may be a normal state or a fault state. As an example, the fault state may include conditions such as too high of an internal or external temperature, too high of a current, too low cell voltage, or a too low stack voltage, but embodiments according to the present invention are not limted thereto. For example, the first control signal 12 may be based on a state signal received by the microcontroller 10. According to some example embodiments, as can be seen in FIGS. 1 and 2, the microcontroller may be configured to generate a second control signal 14, which will be described in more detail below and may be generated in the same way as described above. For example, the control signal may have a low or zero voltage, when it is generated in response to a detected system fault and a high voltage in response to a detected normal system state. Here and in the following, as example, the whole circuit may operate with logic where a high voltage indicates that the system state is normal or functioning properly and the power switch is then closed. This may be enable a relatively higher degree of safety, because it is much more likely that in case of malfunction the signals will default to a low value and this case the power switch is opened.

The control unit 1 further comprises a monitoring unit 20. The monitoring unit 20 is configured to detect an operational state of the microcontroller 10. Further, the monitoring unit 20 is configured to generate a fault signal 22 indicative of the operational state of the microcontroller 10. For example, the fault signal may have a high level voltage, when the microcontroller 10 is in a normal state or a properly functioning state and a zero voltage value, when the microcontroller 10 is in a faulty state. According to some example embodiments, the monitoring unit 20 may be a monitoring chip, for example, a system basis chip but embodiments according to the present invention are not restricted thereto. The monitoring unit 20 may be integrated in the microcontroller 10 or a separate unit.

The control unit 1 further comprises a first signal source 30 configured to generate a state signal 31 indicative of a system state. A system fault may be, for example, an over current, a crash, or a state signal of an analog front end, for example a too high temperature or a voltage drop of battery cells, but embodiments according to the present invention are not restricted thereto. Again, a low voltage level of the state signal 31 may refer to a detected fault state.

The control unit 1 further comprises a comparator circuit 40 configured to receive the first control signal 12 and the fault signal 22. The comparator circuit 40 of an example embodiment is disclosed in FIG. 2, such that reference will be made in the following to FIG. 2.

The comparator circuit 40 is configured to generate an intermediate control signal 41 based on the first control signal 12 and the fault signal 22. The comparator circuit 40 further comprises a comparator node n0. The comparator circuit 40 is thereby configured to transmit the intermediate control signal 41 to the comparator node n0, as it can be seen schematically in FIG. 2. The first signal source 30 is further connected to the comparator node n0. Thereby, the first signal source 30 may transmit the state signal 31 to the comparator node n0.

Further, as can be seen in FIG. 2, the comparator circuit 40 comprises a comparator 50. The comparator 50 is connected to the comparator node n0. The comparator 50 is thereby configured to generate a switch control signal 43 based on a voltage on the comparator node n0 and based on a threshold voltage Vth. The comparator node n0 may be connected to a first input 51 of the comparator 50. The threshold voltage Vth may be input to a second input 52 of the comparator 50. The first input 51 may be a positive input of the comparator 50, and the second input 52 may be a negative input. Therefore, when the node voltage is above the threshold voltage Vth, the switch control signal 43 may be configured to set the power switch closed or keep closed, and when the node voltage is below the threshold voltage Vth, the switch control signal 43 may be configured to set the power switch open.

As illustrated in the present example embodiment of FIG. 1, the microcontroller 10 may be configured to generate also a second control signal 14 which is transmitted to the comparator circuit 40. The comparator circuit 40 then is configured to receive the first control signal 12, the second control signal 14 and the fault signal 22, as can be seen in FIGS. 1 and 2. Then, the comparator circuit 40 may be configured to generate an intermediate control signal 41 based on the first control signal 12, the second control signal 14 and the fault signal 22 and configured to transmit the intermediate control signal 41 to the comparator node n0. An intermediate control signal 41 may be in other words a weighted control signal. The fault signal is hereby used to ensure that a faulty microcontroller 10 cannot switch the power switch.

The first signal source 30 can trigger a signal to the comparator node n0 to subsequently trigger the power switch driver 110 at any time, for example, when a fault state of the microcontroller 10 is detected.

The state signal and the intermediate control signal 41 are transmitted to the comparator node n0. Thus, the comparator node n0 contains diagnostic information which can be used for diagnostic purpose. The present invention allows diagnosing all input signals transmitted to the comparator node n0. Also, as can be seen in FIG. 2, more than one signal sources 30, 32 can be connected to the comparator node n0.

The comparator node n0 may be, as illustrated in FIG. 2, interconnected between a first resistor R1 and a second resistor R2. The first resistor R1 may be, as viewed in FIGS. 1 and 2 connected to the microcontroller 10, for example, via a first control line 11, to receive the first control signal 12. Expressed in other words, the first control signal 12 is transmitted to the first resistor R1 and then to the comparator node n0.

Similarly, the second resistor R2 may be connected to the microcontroller 10, e.g. via a second control line 13, to receive the second control signal 14. Also here, the second control signal 14 is transmitted to the second resistor R2 and then to the comparator node n0. Thus, according to some example embodiments, the first resistor R1 and the second resistor R2 form a resistive voltage divider which transmits an intermediate control signal 41, weighted by the resistors and the fault signal 22, to the comparator node n0. According to some example embodiments, the resistor R1 is equal to (e.g., has an equal resistance as) the second resistor R2. For example, the resistors may have a resistance of 10 kΩ, but embodiments according to the present invention are not restricted thereto.

When, for example, the first control signal 12 has a high value of 5V and the second control signal 14 has a high value of 5V, the comparator node b0 may be held on 5V. In case when only one of the control signals has a high voltage level, the voltage level of the intermediate control signal 41 may be 2.5 V, for example. A threshold voltage Vth may be set such that the voltage of the intermediate control signal 41 is only higher than the threshold voltage Vth, when both the first and the second control signal 12, 14 have a high voltage level. For example, the threshold voltage may be 2.7 volts (V), or more general, between 2.5 V and 5 V or between 2.7 V and 3 V, as example. The above described concept also applies to the simplified version where only one control signal is present.

That is, according to some example embodiments, the intermediate signal 41 may be higher than the threshold voltage Vth when the first and the second control signal 12, 14 are generated in response to a detected normal state of the system and the power switch is then closed. Further, the state signal 31 may be higher than the threshold voltage Vth when the state signal 31 is indicative of an ok system state. Reversely, the intermediate signal 41 may be lower than the threshold voltage Vth when the first and/or the second control signal 12, 14 are generated in response to a detected fault state of the system and the power switch may be opened via the comparator. Further, the state signal 31 may be lower than the threshold voltage Vth, in particular on zero voltage, when the state signal 31 is indicative of a system fault and. Then, the voltage on the comparator node n0 is pulled down and thus the power switch opened, see also the description below. In the latter case, the signal source can prompt an opening of the switch at any time if necessary.

The comparator circuit 40 may further comprise an AND-operator 70, as can be viewed in FIG. 2. According to some example embodiments, the AND-operator 70 may be interconnected between the comparator node n0 and the microcontroller 10.

Here, in this example, a first input of the AND-operator 70 is connected to the microprocessor to receive the first control signal 12. A second input of the AND-operator 70 may be connected to the monitoring unit 20 to receive the fault signal 22 from the monitoring unit 20 as second input. In case of a faulty state of the microcontroller 10, the fault signal 22 may be on a zero voltage level. Then, the output voltage is kept zero regardless of the first control signal 12, such that a high voltage output and thus a closing of the power switch by the microcontroller 10 is efficiently prevented.

The comparator circuit 40 may further comprise a latch unit 60 interconnected between the comparator node n0 and the microcontroller 10.

A first input of the latch unit 60 may be connected to the microcontroller 10 to receive the second control signal 14. A second input may be connected to the monitoring unit 20 to receive the fault signal 22. Thereby, the latch unit 60 is controlled by the fault signal 22. The latch unit may be a transparent latch. The latch unit 60 may be configured to latch the previous output, when the latch unit 60 receives a fault signal 22 indicative of a fault state of the microcontroller 10. Then, regardless of the second control signal 14, the output is held fixed and a faulty controlling of the microcontroller is effectively prevented. The fault signal 22 may be transmitted to both the AND-operator 70 and the latch unit 60 via node n4.

The control unit 1 may further comprise a time delay unit 65 interconnected between the latch unit 60 and the microcontroller 10. Further, a time delay unit 65 is here in this example interconnected between the AND-operator 70 and the microcontroller 10. Thereby, the time delay unit 65 may be configured to delay the first and the second control signal 12, 14 by a time period (e.g., a set or predetermined amount of time). The time period (e.g., the set or predetermined time period) may thereby be equal or larger to the detection time the monitoring unit 20 needs to detect a fault state. Accordingly, instances of a faulty microcontroller 10 transmitting a faulty control signal to the comparator node n0 before the monitoring unit has detected the fault state of the microcontroller may be prevented or reduced.

As can be seen in FIG. 2, the comparator circuit 40 may comprise a first diode D1 interconnected between the first signal source 30 and the comparator node nO. According to some example embodiments, a sixth resistor R6 may be interconnected between the first signal source 30 and the comparator node n0. In here, as example, the cathode of the first diode D1 is connected to the first signal source 30 and the anode of the first diode D1 connected to the comparator node n0.

When the state signal 31 is low due to detection of a fault state the first diode D1 may pull down the voltage on the comparator node n0 below the threshold Vth. Such case may then refer to a case where a system fault is detected by the first signal source 30. By use of the diode D1 the signal source 30 may thus only be able to open/disable the power switch and not to close the power switch.

Further, also a second signal source 32 may be connected to the comparator node n0. Also here, a seventh resistor R7 and a second diode D2 may be provided to prevent the above mentioned effect. More than two signal sources 30, 32 may be connected to the comparator node n0. Thus, embodiments according to the present invention may enable simultaneous handling of a multitude of signal sources.

The comparator node n0 may be, as can be seen in FIGS. 1 and 2, connected to the microcontroller 10. The microcontroller 10 then may receive a diagnostic signal 16 indicative of the present voltage on the comparator node n0. Thereby, a diagnostic feedback is implemented, wherein the microcontroller 10 may be capable of identifying faults. For example, the microcontroller 10 may be reset based on a received diagnostic signal 16. The diagnostic signal may also be transmitted to other entities.

The comparator 50 may further comprise a third resistor R3 interconnected between the output of the comparator 50 and a first input 51 of the comparator 50 which is connected to the comparator node n0, here via node n2. Thereby, the third resistor R3 may provide a hysteresis via the feedback circuit. The switch control signal 43 is thereby stabilized. The value of R3 may be adjusted also in connection with the resistors R1 and R2.

The comparator 50 may further comprise a supply voltage V1 to supply the comparator 50 connected to a supply input of the comparator 50. The other supply voltage may be grounded, as can be viewed in FIG. 2. The power supply V1 may be connected in series with a fourth resistor R4 and a fifth resistor R5, here via node n3. The second input 52 of the comparator 50 may be connected to a node n1 interconnected between the fourth resistor R4 and the fourth resistor R5. The fifth resistor R5 may be grounded as can be seen in FIG. 2. Thereby, a resistive voltage divider is implemented. The resistors R4, R5 thereby determine the threshold voltage Vth. By choosing different values for the resistors R4, R5, the threshold voltage Vth can be flexibly set.

Referring to FIGS. 1 and 3, an example retention feature of the present control unit 1 is further described under reference to the timeline of an output current of a corresponding battery system 100 as shown in FIG. 3.

A first timer 80 may be connected to the monitoring unit 20 to receive the fault signal 22. The first timer 80 may be configured to be activated by the fault signal 22, when the fault signal 22 is indicative of a fault state of the microcontroller 10, see point B in FIG. 3.

Before the detection of the fault, during a normal operation mode, see interval A in FIG. 3, of the battery system 100 and the control unit 1, the microcontroller 10 may operate without fault and a maximum current I'$_{max}$ may be allowed to be provided by the battery system 100. A first signal source 30 may thus be a current comparator with a threshold current of I'$_{max}$. In this time A, the microcontroller 24 itself may set a power switch 120 open via the generated first and second control signals 12, 14 if the microcontroller receives a signal indicating that a current exceeds I'$_{max}$, see the description above. At a time point B shown in FIG. 3, a failure may occur in the microcontroller 10 and is subsequently detected by the monitoring unit 20. Hence, from time point B the fault signal 22 is indicative of a fault state of the microcontroller 10 by, e.g., taking a zero voltage level.

The first signal source 30 may be a current comparator with a threshold current of I'$_{max}$ and may be connected to the comparator node n0, but embodiments according to the present invention are not restricted to a current observation. Also, other signal sources may be used, e.g. for temperature, cell voltage, crash signal, etc., see also the description above.

Figure 4:
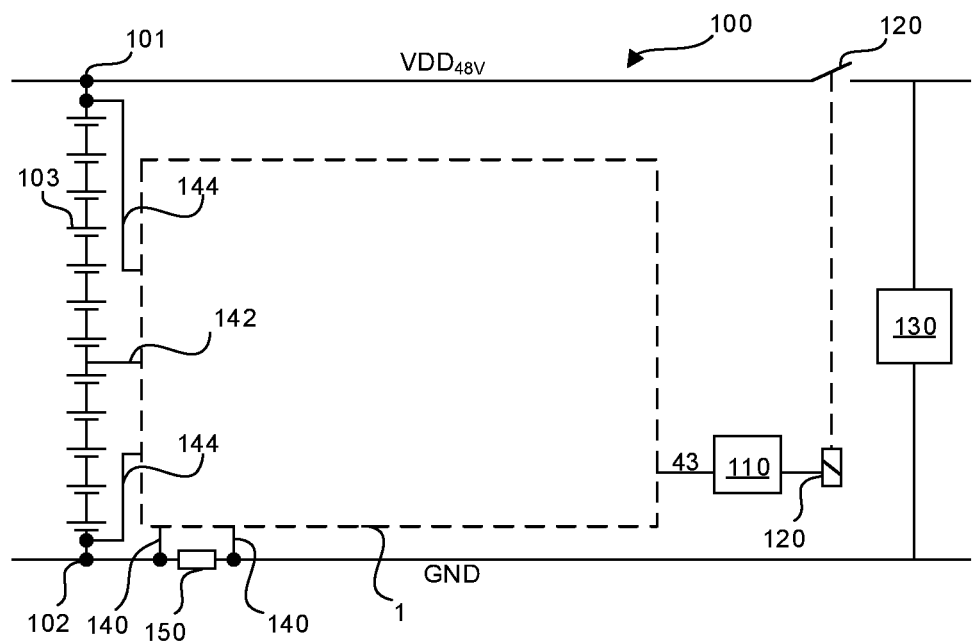
FIG. 4 illustrates a battery system according to some example embodiments of the present invention.

Further, at time point B loads 130, see FIG. 4, or in general, electrical consumers, of an electric vehicle that are supplied by the battery system 100 may be disconnected from the battery system 100, see also FIG. 4 for a corresponding battery system and an example load 130. Hence, as shown in FIG. 3, the current I may be begin to drop from the time point B to increase safety of the vehicle.

In the first time period T1, the diagnostic information from the comparator node n0 as described may be used to reset the microcontroller 10.

The first timer 80 may be, as can be seen in FIG. 1, connected to a second signal source 32 and configured to activate the second signal source 32 after a first time period T1, see point D in FIG. 3. The second signal source 32 is further connected to the comparator node n0, see FIG. 2. The second signal source 32 may be a current comparator to monitor the power consumption, in particular up to a lower current threshold, see the maximum current I"$_{max}$, such that a low consumption mode is established, see also E in FIG. 3. Thus, when a too high current is detected by the second signal source 32 in the second time period T2, the second source may transmit a second state signal 33 to the comparator node n0 as described above.

The control unit 1 may further comprise a second timer 82, see FIG. 1, connected to the monitoring unit 20 to receive the fault signal 22 and configured to be activated by fault signal 22, when the fault signal 22 is indicative of a fault state of the microcontroller 10. The second timer 82 may be configured to shut down a power supply V1 of the comparator 50 and/or the power supply V2 of the power switch, when the second time period T2 is lapsed, see point G in FIG. 3. The second time period T2 is larger than the first time period T1. Thus, at the end of the second time period T2 an availability mode may end and the battery system 100 shut down.

FIG. 4 shows a battery system 100 according to some example embodiments of the present invention. The battery system 100 may comprise a plurality of battery cells 103 electrically connected between a high voltage node 101 and a low voltage node 102.

A power switch 120 may be interconnected between the high voltage node 101 and the low voltage node 102. The control unit 1 according to one of the above described embodiments may be connected with the output of the comparator to a power switch driver 110 of the power switch 120 to transmit the generated switch control signal 43 to the power switch driver 110. Thereby, the control unit 1 may control the power switch via the switch control signal 43. Further, an example load 130 is depicted which consumes the current I of the battery system 100.

Further several additional sensor lines 140, 142, 144 are shown, which may refer to signal sources 30, 32, e.g. comparators, of the control unit 1 as described above. For example a sensor line 142 may refer to temperature measurement, sensor lines 144 to voltage measurement and sensor line 140 to a current measurement via a shunt resistor 150. A first signal source 30 may be a comparator controlling a temperature to be below a threshold temperature, a comparator controlling a current a maximum current from I'$_{max}$ to I"$_{max}$, see above, or a comparator for a voltage below a threshold voltage, but the invention is not restricted thereto and also other signal sources may be included in the control unit 1.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the example embodiments of the present invention.

The referred drawings and the detailed description of the disclosure described are merely example embodiments of the disclosure, are used for merely describing aspects of some example embodiments the disclosure, and are not intended to limit the meaning and the scope of embodiments according to the disclosure as defined in the claims and their equivalents. Therefore, those skilled in the art may understand that various modifications and equivalent other embodiments are possible from these. Thus, the true scope of the disclosure should be determined by the technical spirit of the appended claims and their equivalents.

LIST OF SOME OF THE REFERENCE SYMBOLS 1 control unit
10 microcontroller
11 first control line
12 first control signal
13 second control line
14 second control signal
16 diagnostic signal
20 monitoring unit
22 fault signal
30 first signal source
31 first state signal
32 second signal source
33 second state signal
40 comparator circuit
41 intermediate control signal
43 switch control signal
50 comparator
51 first input
52 second input
n0 comparator node
n1 node
n2 node
n3 node
n4 node
60 latch unit
65 time delay unit
70 AND-operator
80 first timer
82 second timer
T1 first time period
T2 second time period
V1 power supply
V2 power supply
R1 first resistor
R2 second resistor
R3 third resistor
R4 fourth resistor
R5 fifth resistor
R6 sixth resistor
R7 seventh resistor
D1 first diode
D2 second diode
Vth threshold voltage
100 battery system
101 high voltage node
102 low voltage node
103 battery cell
110 power switch driver
120 power switch
130 loadClaims

What is claimed is:

1. A control unit for controlling a power switch of a battery system, comprising:
   a microcontroller configured to generate a first control signal;
   a monitoring unit configured to detect an operational state of the microcontroller and configured to generate a fault signal indicating the operational state of the microcontroller;
   a first signal source configured to generate a state signal indicating a system state; and
   a comparator circuit configured to receive the first control signal and the fault signal and configured to generate an intermediate control signal based on the first control signal and the fault signal,
   the comparator circuit comprising a comparator node, wherein the comparator circuit is configured to transmit the intermediate control signal to the comparator node,
   wherein the first signal source is connected to the comparator node to transmit the state signal to the comparator node,
   wherein the comparator circuit further comprises a comparator connected to the comparator node and is configured to generate a switch control signal for controlling the power switch based on a voltage of the comparator node and based on a threshold voltage, and
   wherein a first input of the comparator is connected to the comparator node and a second input of the comparator is configured to receive the threshold voltage.

2. The control unit of claim 1, wherein the microcontroller is configured to generate a second control signal and the comparator circuit is configured to receive the first control signal, the second control signal and the fault signal, and configured to generate an intermediate control signal based on the first control signal, the second control signal and the fault signal and configured to transmit the intermediate control signal to the comparator node.

3. The control unit of claim 2, wherein the comparator node is interconnected between a first resistor and a second resistor, wherein the first resistor is connected to the microcontroller via a first control line to receive the first control signal, wherein the second resistor is connected to the microcontroller via a second control line to receive the second control signal.

4. The control unit of claim 2, further a latch unit interconnected between the comparator node and the microcontroller,
   wherein a first input of the latch unit is connected to the microcontroller to receive one of the first and second control signals, and a second input of the latch unit is connected to the monitoring unit to be controlled by the fault signal, and
   wherein the latch unit is configured to latch a previous output, when the latch unit receives a fault signal indicative of a fault state of the microcontroller.

5. The control unit of claim 2, wherein an AND-operator is interconnected between the comparator node and the microcontroller,
   wherein a first input of the AND-operator is connected to the microcontroller to receive one of the first and second control signals, and a second input of the AND-operator is connected to the monitoring unit to receive the fault signal.

6. The control unit of claim 5, further comprising a time delay unit interconnected between the latch unit and the microcontroller and/or interconnected between the AND-operator and the microcontroller, wherein the time delay unit is configured to delay the first and/or the second control signal by a predetermined time.

7. The control unit of claim 1, wherein the comparator circuit comprises a diode interconnected between the first signal source and the comparator node.

8. The control unit of claim 1, wherein the comparator node is connected to the microcontroller to receive a diagnostic signal indicative of a present voltage on the comparator node.

9. The control unit of claim 1, comprising a first timer connected to the monitoring unit to receive the fault signal and configured to be activated by fault signal, when the fault signal is indicative of a fault state of the microcontroller, wherein the first timer is connected to a second signal source and configured to activate the second signal source after a first time period, the second signal source further connected to the comparator node.

10. The control unit of claim 9, further comprising a second timer connected to the monitoring unit to receive the fault signal and configured to be activated by the fault signal, in response to the fault signal indicating a fault state of the microcontroller, wherein the second timer is configured to shut down a power supply of the comparator, in response to the second time period being lapsed, wherein the second time period larger than the first time period.

11. The control unit of claim 2, wherein the intermediate signal is lower than the threshold voltage, in response to the first and/or the second control signal being generated in response to a detected system fault; and the state signal is lower than the threshold voltage, in response to the state signal indicating a system fault.

12. The control unit of claim 1, wherein the comparator comprises a third resistor interconnected between the output of the comparator and the first input of the comparator.

13. The control unit of claim 1, wherein the comparator comprises a supply voltage connected in series with a fourth resistor and a fifth resistor, wherein the second input of the comparator is connected to a node interconnected between the fourth resistor and the fifth resistor.

14. A battery system comprising a plurality of battery cells electrically connected between a high voltage node and a low voltage node, a power switch interconnected between the high voltage node and the low voltage node, and a control unit according to claim 1, wherein the output of the comparator of the control unit is connected to a power switch driver of the power switch.

15. An electric vehicle including a battery system according to claim 14.

* * * * *